United States Patent
Lee et al.

(10) Patent No.: US 6,583,690 B2
(45) Date of Patent: Jun. 24, 2003

(54) SAW FILTER MANUFACTURED BY USING GAN SINGLE CRYSTAL THIN FILM, AND MANUFACTURING METHOD THEREFORE

(75) Inventors: Yong Hyun Lee, Taegu (KR); Jung Hee Lee, Taegu (KR); Suk Hun Lee, Taegu (KR); Young Sik Choi, Seoul (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 0 days.

(21) Appl. No.: 09/725,064

(22) Filed: Nov. 29, 2000

(65) Prior Publication Data

US 2001/0011935 A1 Aug. 9, 2001

(30) Foreign Application Priority Data

Jan. 17, 2000 (KP) .......................... 2000-1928

(51) Int. Cl.⁷ ............................. H03H 9/64; H03H 3/08
(52) U.S. Cl. ................. 333/193; 29/25.35; 310/313 A; 310/313 B; 427/100
(58) Field of Search ................. 333/193–196; 310/313 R, 358, 360; 29/25.35; 427/100

(56) References Cited

U.S. PATENT DOCUMENTS

| | | | |
|---|---|---|---|
| 3,922,475 A | * 11/1975 | Manasevit | 428/539 |
| 3,955,160 A | * 5/1976 | Duffy | 310/313 R X |
| 4,019,200 A | * 4/1977 | Adkins et al. | 357/26 |
| 4,855,249 A | * 8/1989 | Akasaki et al. | 437/81 |
| 5,936,329 A | * 8/1999 | Shibata et al. | 310/313 A X |
| 6,045,626 A | * 4/2000 | Yano et al. | 148/33.4 |

FOREIGN PATENT DOCUMENTS

| | | |
|---|---|---|
| EP | 0 999 640 A2 | * 5/2000 |
| JP | 8-310900 | * 11/1996 |
| JP | 9-312546 | * 12/1997 |

OTHER PUBLICATIONS

Th. Pastureaud et al.; "AlN and GaN Layers Deposited on Sapphire or Silicon Substrates: Theory and Experiment"; *2000 IEEE Ultrasonics Symposium*, vol. 1, pp. 293–297, Oct. 22–25, 2000.*

D. Ciplys et al.; "Effect of Metallisation on Surface Acoustic Wave Velocity in GaN–on–Sapphire Structures"; *Electronics Letters*; vol. 36, No. 6, pp. 591–592, Mar. 16, 2000.*

* cited by examiner

Primary Examiner—Barbara Summons
(74) Attorney, Agent, or Firm—Lowe Hauptman Gilman & Berner, LLP (57) ABSTRACT

A SAW (surface acoustic wave) filter manufactured by using a GaN piezoelectric thin film, and a manufacturing method therefor, are disclosed. The SAW filter of a high frequency band includes an $\alpha$-$Al_2O_3$ single crystal substrate. A GaN piezoelectric single crystal thin film of [0001] direction is formed to a thickness of 0.3–300 $\mu$m on the substrate, and an IDT electrode pattern is formed on the GaN piezoelectric single crystal thin film. The method for manufacturing a SAW filter of a high frequency band includes the following steps. An $\alpha$-$Al_2O_3$ single crystal substrate is prepared, and then, a GaN piezoelectric single crystal thin film of [0001] direction is epitaxially grown to a thickness of 0.3–300 $\mu$m on the substrate. Then an IDT electrode pattern is formed on the GaN piezoelectric single crystal thin film.

16 Claims, 2 Drawing Sheets

SAW FILTER MANUFACTURED BY USING GAN SINGLE CRYSTAL THIN FILM, AND MANUFACTURING METHOD THEREFORE

BACKGROUND OF THE INVENTION

1. Field of the Invention

The present invention relates to a SAW (surface acoustic wave) filter manufactured by using a GaN piezoelectric thin film, and a manufacturing method therefor. More specifically, the present invention relates to a SAW filter manufactured by using a GaN piezoelectric thin film, and a manufacturing method therefor, in which the filter is obtained by forming a GaN thin film of [0001] direction on a single crystal substrate, and in which the characteristics are superior.

2. Description of the Prior Art

Recently, countries are progressing toward information societies, and in accordance with this trend, the demands for mobile communication are steeply increasing, because it is not subjected to the time limitation and the spatial limitation. If the mobile communication apparatus is to be ensured of its stable operation, not only the system development is important, but also there has to be developed a high performance filter which shows a high sidelobe decay and a frequency stability at high frequency regions.

Further, it is the current trend that the bulk of the mobile communication apparatus becomes smaller, and its components are also provided in the form of a reduced package. Accordingly, in the case of the filter also, the LC filter of the past has been replaced with the dielectric filter, and the dielectric filter is again being replaced with the SAW (surface acoustic wave) filter.

The SAW filter, which is calling attention as the crucial component of the mobile communication apparatus, is gaining its importance as a new component for the image system such as TV broadcasting, HDTV, CATV and the like. Further, in accordance with the expansion in the demand for the mobile communication, the development of a high frequency device of the order of over GHz is being required. To meet this demand, there is being developed the SAW filter which is efficiently operable at a high frequency.

In the research for the development of the GHz band SAW filter, there are required a material having the SAW propagation velocity, a submicron process technology, and a development of a harmonic mode SAW filter.

In manufacturing the SAW filter for utilizing the advantages of the LSAW (Leaky SAW) which has a propagation velocity and an electromechanical coupling factor which are much higher compared with the Rayleigh waves, the following techniques have been known. That is, there is used a substrate which is composed of a piezoelectric single crystal such as 36° $LiTaO_3$, 41° $LiNbO_3$, 64° $LiNbO_3$, LST quartz or the like. In these conventional SAW filters which use $LiNbO_3$, $LiTaO_3$, quartz or the like, the application fields are different depending on the raw material used. That is, in the case of the $LiNbO_3$ single crystal, the $k^2$ value of the electromechanical coupling factor is large, and therefore, it is applied to the wide band width filters. However, it has a disadvantage such that the thermal stability is low. In the case of quartz, although the temperature stability is superior, the propagation velocity and the $k^2$ value of the electromechanical coupling factor are low compared with the $LiNbO_3$ and $LiTaO_3$ single crystals. In the case of $LiTaO_3$, the electromechanical coupling factor is higher than quartz, and the temperature stability is superior compared with $LiNbO_3$, thereby making it possible to compensate the disadvantages of $LiNbO_3$.

However, in the case of the SAW filters using the above described piezoelectric single crystals, the decay constant is high, with the result that the propagation loss is large.

Generally, in the SAW filter, it is required that the $k^2$ value of the electromechanical coupling factor be high, and the temperature stability be superior. In the currently used piezoelectric devices, however, due to the fact that they are mostly made of a single crystal, if the crystal face and the direction for the propagation of the surface acoustic wave are decided, then the propagation velocity and the $k^2$ value of the electromechanical coupling factor become almost constant.

Accordingly, when the propagation velocity and the $k^2$ value are constant, the resonance frequency is decided by the inter-electrode distance of the IDT (interdigital transducer) electrodes. Therefore, if the frequency is to be raised, the electrode pattern width has to be reduced, and therefore, a technical limitation is exposed at frequencies higher than 2 GHz. Particularly, in the case of the duplexer for the PCS, the electrode width has to be reduced to about 0.35 μm, and therefore, it is difficult to satisfy the maximum input power characteristics which are required at the Tx terminal of the duplexer. Further, in the case where the SAW filter of single crystal is applied to an RFIC, it is difficult to form it in a single chip. Therefore, it has to be formed in the hybrid type, with the result that the manufacturing process becomes complicated, and that a high density becomes difficult.

SUMMARY OF THE INVENTION

The present invention is intended to overcome the above described problems of the conventional techniques.

Therefore it is an object of the present invention to provide a SAW filter of a high frequency band, in which a GaN thin film is formed to the optimum thickness on an α-$Al_2O_3$ single crystal substrate, thereby obtaining superior piezoelectric characteristics and superior input/output characteristics.

It is another object of the present invention to provide a method for manufacturing a SAW filter of a high frequency band, in which a GaN thin film is formed to the optimum thickness and at certain heat treatment conditions on an α-$Al_2O_3$ single crystal substrate.

The conditions for manufacturing the SAW filter of the present invention can be derived from the following formula:

<Formula>

$$fo=Vo/2L$$

where fo is the resonance frequency, Vo is the SAW propagation velocity, and L is the IDT inter-electrode distance.

That is, as can be seen in the above formula, if a SAW filter of a high resonance frequency is to be manufactured, either the SAW propagation velocity has to be high, or the IDT inter-electrode distance has to be short. However, the SAW propagation velocity is determined only by the inherent properties of the piezoelectric single crystal thin film. Further, as described above, the technology of reducing the IDT inter-electrode distance encounters a technical limitation in manufacturing the SAW filter of over 2 GHz.

Therefore, the present inventor carried out very much research to find out a piezoelectric single crystal device which can overcome the above described limitations. As a result, the following fact was found. That is, if a GaN single crystal thin film is formed in the optimum thickness on an α-Al$_2$O$_3$ single crystal substrate, a SAW carrier velocity was 1.5 times as fast as that of the conventional LiNbO$_3$ and LiTaO$_3$ single crystal substrate. Therefore, even at the same IDT inter-electrode width, a resonance frequency of higher band can be obtained.

Therefore, in one aspect of the present invention, the SAW filter of a high frequency band according to the present invention includes: an α-Al$_2$O$_3$ single crystal substrate; a GaN piezoelectric single crystal thin film of [0001] direction formed to a thickness of 0.3–300 μm on the substrate; and an IDT electrode pattern formed on the GaN piezoelectric single crystal thin film.

In another aspect of the present invention, the method for manufacturing a SAW filter of a high frequency band according to the present invention includes the steps of: preparing an α-Al$_2$O$_3$ single crystal substrate; epitaxially growing a GaN piezoelectric single crystal thin film of [0001] direction to a thickness of 0.3–300 μm on the substrate; and forming an IDT electrode pattern on the GaN piezoelectric single crystal thin film.

BRIEF DESCRIPTION OF THE DRAWINGS

The above objects and other advantages of the present invention will become more apparent by describing in detail the preferred embodiment of the present invention with reference to the attached drawings in which.

DETAILED DESCRIPTION OF THE PREFERRED EMBODIMENT

In manufacturing the SAW filter according to the present invention, it is the major feature that a GaN thin film of [0001] direction is formed as the piezoelectric single crystal device.

This GaN thin film is formed on an α-Al$_2$O$_3$ single crystal substrate. Under this condition, the GaN thin film should be preferably formed on the α-Al$_2$O$_3$ single crystal substrate which has (0001), (1102) and (1120) faces. If the most superior characteristics are to be ensured, the GaN thin film should be preferably formed on the α-Al$_2$O$_3$ single crystal substrate which has a (0001) face.

Further, in the present invention, the substrate may be a silicon substrate, an SiC substrate, a spenel (MgAl$_2$O$_3$) substrate, or a GaN single crystal substrate, each of them having (100) and (111) faces.

In the present invention, the GaN piezoelectric single crystal thin film of the [0001] direction which is formed on the single crystal substrate is limited to a thickness of 0.3–300 μm, and the reason is as follows. That is, during the growth of the semiconductor GaN, if the surface is to be smooth, and if the crystal quality is to be superior, then the growth has to be 2-dimensional. The minimum thickness for this is 0.3 μm. Meanwhile, the thickness of the thin film cannot be made infinite due to the limitation of the growth speed, and therefore, the upper limit is defined to be 300 μm.

In forming the GaN thin film, the following apparatus is required. That is, there is required: an MOCVD (metal organic chemical vapor deposition) apparatus, an MBE (molecular beam epitaxy) apparatus, a VPE (vapor phase epitaxy) apparatus, or an HVPE (hybrid vapor phase epitaxy) apparatus. Further, there is required an Mo source such as TMGa (trimethyl gallium), DMZn (dimethyl zinc), or Cp$_2$Mg (bis-cyclopentadienyl magnesium). Further, high purity NH$_3$ and H$_2$gases are required. Through the above apparatus and materials, a thickness of 0.3 μm or above can be obtained.

In the present invention, the GaN piezoelectric single crystal thin film which is formed on the single crystal substrate should be more preferably limited to a thickness of 0.5–10 μm, and the reason is as follows. That is, the width of the electrode pattern of the SAW filter is about 1 μm, and in view of this fact, if the thickness of the thin film is less than 0.5 μm, then the signals may be transmitted down to the substrate, so that an insertion loss may occur. On the other hand, there are differences in the lattice constants and the thermal expansion coefficients between the substrate and the electrode. Therefore, if the thickness of the GaN thin film exceeds 10 μm, then the occurrence of defects becomes frequent during the growth, with the result that it becomes difficult to grow a high quality GaN piezoelectric single crystal thin film in the c-axis direction [0001].

Further, in the present invention, in order to improve the bulk resistivity and the surface resistance, there can be formed an Mg-doped GaN or Zn-doped GaN piezoelectric single crystal thin film or an insulating undoped GaN single crystal thin film on a single crystal substrate.

Meanwhile, in the present invention, a GaN buffer layer can be formed to a thickness of 200–500 Å between the GaN piezoelectric single crystal thin film and the single crystal substrate. This buffer layer is for minimizing the difference in the lattice constants and the thermal expansion coefficients between the GaN piezoelectric single crystal thin film and the single crystal substrate, thereby making it possible to obtain a high quality GaN single crystal thin film.

Further, an IDT electrode pattern is formed on the GaN piezoelectric single crystal thin film of the [0001] direction, which is formed on the α-Al$_2$O$_3$ single crystal substrate. Accordingly, the SAW filter of the present invention shows a low insertion loss anda superior frequency characteristic. Further, in the case where the IDT electrode pattern is on the order of submicron, a superior response characteristic can be obtained even at a band of 1.4 GHz.

Now the method for manufacturing the SAW filter of the present invention will be described.

First, in the present invention, there is prepared a single crystal substrate on which a GaN single crystal thin film of the [0001] can be grown.

The crystal structure and the surface conditions of the single crystal substrate greatly affect the growth of the GaN piezoelectric single crystal thin film. Accordingly, in the present invention, by considering the fact that the c-axis of the GaN single crystal is in the [0001] direction, and that the crystal structure is hexagonal, an α-Al$_2$O$_3$ single crystal of the same structure is selected as the substrate.

Preferably, an α-Al$_2$O$_3$ single crystal having the (0001), (1102 and (1120) faces is selected as the substrate. More preferably, an α-Al$_2$O$_3$ single crystal having the (0001) face is selected as the substrate.

As described above, in the present invention, the substrate may be a silicon substrate, an SiC substrate, a spenel (MgAl$_2$O$_3$) substrate, or a GaN single crystal substrate, each of them having (100) and (111) faces.

A GaN piezoelectric single crystal thin film of [0001] direction is epitaxially grown to a thickness of 0.3–300 μm upon the substrate. Under this condition, the thickness of the GaN thin film is limited to 0.3–300 μm, and more preferably is limited to 0.5–10 μm.

Meanwhile, prior to epitaxially growing the GaN thin film, a GaN buffer layer is preferably formed to a thickness of 200–500 Å on the single crystal substrate. This buffer layer minimizes the differences in the lattice constants and the thermal expansion coefficients between the GaN piezoelectric single crystal thin film and the single crystal substrate, thereby making it possible to obtain a high quality GaN single crystal thin film. The buffer layer is preferably formed at a temperature of 480–500° C.

Meanwhile, in the present invention, the GaN piezoelectric single crystal thin film can be formed based on a method selected from the group consisting of: an MOCVD method, an MBE method, a VPE method, and an HVPE method. Meanwhile, the heat treating conditions for forming the GaN piezoelectric single crystal thin film will be described below.

In the cases of the MOCVD method and the MBE method, the GaN piezoelectric single crystal thin film is grown preferably at a temperature of 600–900° C. Meanwhile, in the cases of the VPE method and the HVPE method, the thin film is grown preferably at a temperature of 800–1100° C. The reason is as follows. That is, the single crystal cannot be efficiently grown below the lower limit of the temperature range, and if it is so grown, then the surface roughness and the like can be defective. On the other hand, if the upper limit is exceeded, although the growth of the single crystal is efficient, source dissociations occur on the surface. As a result, the surface roughness is aggravated, thereby leading to quality degradations.

The supply rate of the Ga source for GaN should be preferably 1–300 μmol/min during the growth of the single crystal based on the MOCVD method, the MBE method, the VPE method or the HVPE method. The reason for the limitation is as follows. That is, if the supply rate is less than 1 μmol/min, then the growth of the single crystal is not efficient, while if it exceeds 300 μmol/min, then the obtained thin film gives too rough a surface, thereby leading to a quality degradation.

Under this condition, the Ga source for GaN may be TMGa, or TEGa.

Meanwhile, the supply rate of the N source for GaN should be preferably limited to 1–20 slpm during the growth of the single crystal based on the MOCVD method, the MBE method, the VPE method, and the HVPE method. If it is less than 1 slpm, the growth of the single crystal cannot be efficiently carried out, while if it exceeds 20 slpm, then the quality of the obtained thin film is degraded.

The preferable examples of the N source for GaN are $NH_3$, $N_2$ and the like.

When growing the single crystal based on the MOCVD method, the MBE method, the VPE method or the HVPE method, the flow rate of the carrier gas should be preferably limited to 1–20 slpm, and the intra-chamber pressure should be preferably limited to 1–760 Torr. These ranges are suitable for growing the GaN single crystal by using the above mentioned apparatus.

Meanwhile, in the present invention, in the case where Zn is doped into GaN, when growing the single crystal based on the MOCVD method, the MBE method, the VPE method or the HVPE method, DMZn should be preferably supplied at a rate of 0.06–10 μmol/min, and the reason for the limitation is as follows. That is, DMZn thus supplied acts as the dopant, so that the resistivity of the single crystal thin film would be increased. Therefore, it is required that its flow rate should be 0.06 μmol/min or more. On the other hand, if it is supplied at more than the amount suitable for the solubility, then the crystallization and the surface roughness of the thin film are aggravated. Therefore, DMZn should be supplied at a rate of 10 μmol/min or less.

Further, in the present invention, in the case where Mg is doped into GaN, when growing the single crystal based on the MOCVD method, the MBE method, the VPE method or the HVPE method, $Cp_2Mg$ should be supplied preferably at a rate of 0.2–6 μmol/min, and the reason for the limitation is as follows. That is, if the Mg source is supplied at a rate of less than 0.2 μmol/min, then the p type dopant cannot act, with the result that the resistivity of the thin film cannot be increased. On the other hand, if the supply rate is more than 6 μmol/min, then the doped Mg exceeds the solubility, with the result that hexagonal pits are formed during the growth of the single crystal. Consequently, the crystal quality and the surface roughness are aggravated.

Further, in the present invention, when growing the single crystal based on the MOCVD method, the MBE method, the VPE method or the HVPE method, a dopant such as Mg or Zn can be added, and in this case, a heat treatment can be carried out. However, this heat treatment may be skipped, but in the case where it is carried out, it can be carried out either within the epitaxial growing apparatus, or it can be carried out in another separate apparatus. In the latter case, a furnace or a rapid thermal annealing apparatus may be used.

In the case where the heat treatment is carried out within the epitaxial growing apparatus, it is preferably carried out at a temperature of 600–900° C. under an $N_2$ atmosphere or an $NH_3/H_2$ mixed atmosphere. If the heat treatment is carried out at below 600° C., although the surface roughness is less affected, the resistivity is decreased. On the other hand, if the temperature is over 900° C., then the surface roughness is increased.

In the case where the heat treatment is carried out in a separate apparatus such as a heating furnace or a rapid thermal annealing (RTA) apparatus, the heat treatment should be carried out preferably at a temperature of 400–900° C. under an nitrogen atmosphere. If the temperature is below 400° C., although the surface roughness is superior, the resistivity is aggravated. On the other hand, if the temperature is over 900° C., then the surface roughness is increased.

The heat treatment should be preferably carried out for 1–60 minutes, and the reason for the limitation is as follows. That is, if the time period is less than 1 minute, then the dopant cannot be sufficiently activated, with the result that the resistivity cannot be sufficiently increased. On the other hand, if the time period exceeds 60 minutes, although the dopant is sufficiently activated to increase the resistivity up to $10^6$ Ω-cm, the surface is adversely affected by the high temperature, with the result that the surface roughness is aggravated.

Further, in the present invention, besides Zn and Mg, there can be used other dopants such as Be or the like.

The GaN piezoelectric single crystal thin film of the [0001] direction is formed to the required thickness through the above described process. Then an IDT electrode pattern is formed on the GaN thin film, thereby manufacturing the high frequency band SAW filter.

Now the present invention will be described in more details based on actual examples.

<EXAMPLE 1>

A single crystal growing was carried out based on the epitaxial growing process to a thickness of 1 μm, thereby forming a GaN thin film upon an α-Al$_2$O$_3$ single crystal substrate having a (0001) face. For this growth, the conditions were as follows. That is, the buffer layer had a thickness of 350 A, and the MOCVD apparatus was used, while the crystal growing temperature was varied as shown in Table 1 below. Further, the Ga source for GaN was TMGa, and it was supplied at a flow rate of 103 μmol/min. The N source for GaN was NH$_3$, and it was supplied at a flow rate of 7 slpm. The carrier gas H$_2$ was supplied at a rate of 7 slpm, and the intra-chamber pressure was maintained at 200 Torr. The DMZn as the dopant source was supplied at a flow rate of 3 μmol/min.

concentration, the mobility, the surface resistivity and the bulk resistivity were measured for the test pieces.

In the case of an undoped GaN, the usual value is $10^{16}$/cm$^3$–$10^{17}$/cm$^3$. In this example, if the measured carrier concentration value was 5×$10^{16}$/cm$^3$ or less, then this was thought to be superior, and was indicated by O in Table 1. If the value was 5×$10^{16}$/cm$^3$–1×$10^{17}$/cm$^3$, then this was thought to be relatively superior, and this was indicated by Δ in Table 1. If the value exceeded $10^{18}$/cm$^3$, then this was thought to be inadequate, and this was indicated by x in Table 1.

TABLE 1

|  | 850° C. | 900° C. | 1000° C. | 1020° C. | 1050° C. | 1100° C. | 1150° C. |
| --- | --- | --- | --- | --- | --- | --- | --- |
| Crystal quality | x | Δ | o | o | o | Δ | x |
| Surface Roughness | Δ | o | o | o | o | o | Δ |
| Carrier concentration | x | Δ | o | o | o | Δ | Δ |

For the thin film thus obtained, the surface roughness and the carrier concentration were evaluated, and the results are shown in Table 1 below. Under this condition, the evaluations were carried out in the following manner.
(Crystallization)

In order to carry out an X-ray diffraction analysis, X-rays were irradiated onto the frontal face of the grown single crystal, and the FWHM (full width half maximum) value of the diffraction peak was taken to decide the characteristic. As the FWHM value is low, so much the crystallization is superior.

In the case of GaN, if the FWHM value was 200–400 arcsec, then the crystallization was thought to be superior. Further, the crystallization direction can be simultaneously measured, and the GaN thin film was grown in the [0001] c-axis direction. Therefore, it can be judged that if the crystal had not been grown in the [0001] c-axis direction, then the crystal quality would not have been adequate.

If the measured FWHM value was 300 arcsec or less, then it was thought to be superior, and therefore, it was indicated by O. If the value was 300–500 arcsec, then it was thought to be relatively superior, and this was indicated by Δ in table 1. If the value exceeded 500 arcsec, then it was thought to be not adequate, and this was indicated by x in table 1.
(Surface Roughness)

An AFM (atomic force microscopy) measured the surface of the GaN thin film in the atomic units by utilizing its sharp tip. The rms (root mean square) value which was obtained by the AFM decided the characteristics of the thin film, and as its value is low, so much the characteristics are superior.

In the case of GaN, the rms value of the average surface roughness is usually less than several ($10^{-10}$ m). In this example 1, if the measured rms value was 5 or less, then it was thought to be superior, and this was indicated by O in Table 1. If the value was 5–15 A, then this was thought to be relatively superior, and this was indicated by Δ in Table 1. If the value exceeded 15 , then this was thought to be inadequate, and this was indicated by x in Table 1.
(Carrier Concentration)

The hall measurement method was adopted for measuring the carrier concentration. That is, a magnetic field was established on the test pieces, and then, a voltage and a current were supplied to the test pieces. Thus the carrier As can be seen in Table 1 above, at the range of 900–1100° C. which meets the conditions of the MOCVD method in the present invention, the crystal quality and the surface roughness were superior. In the carrier concentration also, the carrier concentration value was $10^{16}$/cm$^3$–$10^{17}$/cm$^3$, and therefore, the thin film was superior.

In contrast to this, in the case where the growth temperature was below 900° C., crystal defects were prevalent, and cubic or wurtzite crystalline structures were mixedly present, thereby aggravating the crystal quality. Further, due to the presence of the various crystal defects, the 2-dimensional growth quality was degraded, thereby increasing the surface roughness. Further, the prevalent crystal defects increased the carrier concentration to more than $10^{18}$/cm$^3$, thereby aggravating the quality of the single crystal thin film. On the other hand, in the case where the growth temperature exceeded 1100° C., the buffer layer which had been grown at a low temperature was adversely affected, thereby further increasing the occurrence of the crystal defects. Further, due to the surface dissociation of the nitrogen source, the crystal quality was further aggravated. Further, due to the surface dissociation of the source material which was caused by the high growth temperature, the surface roughness was further deteriorated. Further, the same surface dissociation led to a carrier concentration of 5×$10^{17}$/cm$^3$.

<EXAMPLE 2>

A single crystal growing was carried out based on the epitaxial growing process to a thickness of 1 μm, thereby forming a GaN thin film upon an α-Al$_2$O$_3$ single crystal substrate having a (0001) face. For this growth, the conditions were as follows. That is, the MOCVD apparatus was used, TMGa as the Ga source for GaN was varied as shown in Table 2 below, while the crystal growing temperature was 1000° C. Further, the N source for GaN was NH$_3$, and it was supplied at a flow rate of 7 slpm. The carrier gas H$_2$ was supplied at a rate of 7 slpm, and the intra-chamber pressure was maintained at 200 Torr. The DMZn as the dopant source was supplied at a flow rate of 3 μmol/min.

For the thin film thus obtained, the crystal quality and the surface roughness were evaluated, and the evaluated results are shown in Table 2 below. The evaluations were carried out in a manner same as that of Example 1.

TABLE 2

|                  | 0.5 μmol | 100 μmol | 350 μmol |
|------------------|----------|----------|----------|
| Crystal quality  | x        | ○        | x        |
| Surface roughness| x        | ○        | x        |

As can be seen in Table 2 above, at the flow rate of 100 μmol/min of the Ga source which meets the conditions of the MOCVD method in the present invention, the crystal quality and the surface roughness were superior.

In contrast to this, in the case where the flow rate of the Ga source was less than 1 μmol/min, the Ga source could not reach the substrate, and the growth speed was also slowed, with the result that the crystal quality and the surface roughness were degraded. On the other hand, in the case where the flow rate exceeded 300 μmol/min, the source reacted prior to reaching the substrate so as to cause pre-reactions, with the result that the crystal quality and the surface roughness were deteriorated.

<EXAMPLE 3>

A single crystal growing was carried out based on the epitaxial growing process to a thickness of 1 μm, thereby forming a GaN thin film upon an α-$Al_2O_3$ single crystal substrate having a (0001) face. For this growth, the conditions were as follows. That is, the MOCVD apparatus was used, $NH_3$ as the N source for GaN was varied as shown in Table 3 below, while the crystal growing temperature was 1000° C. Further, the Ga source for GaN was TMGa, and it was supplied at a flow rate of 103 μmol/min. The carrier gas $H_2$ was supplied at a rate of 7 slpm, and the intra-chamber pressure was maintained at 200 Torr. The DMZn as the dopant source was supplied at a flow rate of 3 μmol/min.

For the thin film thus obtained, the crystal quality and the surface roughness were evaluated, and the evaluated results are shown in Table 3 below. The evaluations were carried out in a manner same as that of Example 1.

TABLE 3

|                  | 0.5 slpm | 7 slpm | 25 slpm |
|------------------|----------|--------|---------|
| Crystal quality  | x        | ○      | x       |
| Surface roughness| x        | ○      | x       |

As can be seen in Table 3 above, in the case where the N source supply rate was 7 slpm which satisfied the MOCVD method in the present invention, the crystal quality and the surface roughness were all superior.

In contrast to this, in the case where the flow rate of the N source was less than 1 slpm, the N source could not reach the substrate, and the growth speed was slowed also, with the result that the crystal quality and the surface roughness were degraded. On the other hand, in the case where the flow rate exceeded 20 slpm, the source reacted prior to reaching the substrate so as to cause pre-reactions, with the result that the crystal quality and the surface roughness were deteriorated.

<EXAMPLE 4>

A single crystal growing was carried out based on the epitaxial growing process to a thickness of 1 μm, thereby forming a GaN thin film upon an α-$Al_2O_3$ single crystal substrate having a (0001) face. For this growth, the conditions were as follows. That is, the MOCVD apparatus was used, and the flow rate of the carrier gas was varied as shown in Table 4 below, while the crystal growing temperature was 1000° C. Further, the Ga source for GaN was TMGa, and it was supplied at a flow rate of 103 μmol/min. The N source $NH_3$ for GaN was supplied at a flow rate of 7 slpm. The intra-chamber pressure was maintained at 200 Torr. The DMZn as the dopant source was supplied at a flow rate of 3 μmol/min.

For the thin film thus obtained, the crystal quality and the surface roughness were evaluated, and the evaluated results are shown in Table 4 below. The evaluations were carried out in a manner same as that of Example 1.

TABLE 4

|                  | 0.8 slpm | 10 slpm | 23 slpm |
|------------------|----------|---------|---------|
| Crystal quality  | Δ        | ○       | Δ       |
| Surface roughness| Δ        | ○       | Δ       |

As can be seen in Table 4 above, in the case where the flow rate of the carrier gas was less than 1 slpm, there was the apprehension that the sources could not reach the substrate. Further, the sources were subjected to the pre-reactions, with the result that the characteristics of the thin film were degraded. On the other hand, in the case where the flow rate exceeded 20 slpm, the mutual reactions between the source gases decreased due to the excessive supply of the carrier gas, with the result that the characteristics of the thin film were degraded.

<EXAMPLE 5>

A single crystal growing was carried out based on the epitaxial growing process to a thickness of 1 μm, thereby forming a GaN thin film upon an α-$Al_2O_3$ single crystal substrate having a (0001) face. For this growth, the conditions were as follows. That is, the MOCVD apparatus was used, and the flow rate of the DMZn as the source of the dopant Zn was varied as shown in Table 5 below, while the crystal growing temperature was 1000° C. Further, the Ga source for GaN was TMGa, and it was supplied at a flow rate of 103 μmol/min. The N source $NH_3$ for GaN was supplied at a flow rate of 7 slpm, and the carrier gas $H_2$ was supplied at a flow rate of 7 slpm. The intra-chamber pressure was maintained at 300 Torr.

For the thin film thus obtained, the crystal quality and the surface roughness were evaluated, and the evaluated results are shown in Table 5 below. The evaluations were carried out in a manner same as that of Example 1.

TABLE 5

|                  | 0.5 μmol | 1 μmol | 12 μmol |
|------------------|----------|--------|---------|
| Crystal quality  | ○        | ○      | Δ       |
| Surface roughness| ○        | ○      | Δ       |
| Resistivity      | Δ        | ○      | ○       |

As can be seen in Table 5 above, in the case where the flow rate of Zn was less than 0.06 μmol/min, the action of the dopant was too insignificant. On the other hand, in the case where it exceeded 10 μmol/min, this p-type dopant exceeded the solubility level, and therefore, the crystal quality and the surface roughness were aggravated.

Meanwhile, in the case where the Zn supply rate was 1 μmol/min as shown in Table 5, a part of the test pieces was heat-treated at the temperatures and time as shown in Table 6 below within the same crystallizing chamber under the $NH_3/H_2$ atmosphere, while another part of them was made to undergo an RTA (rapid thermal annealing) at the real time and the temperatures as shown in Table 7 below.

For the thin film thus heat-treated, the surface roughness and the resistivity were evaluated, and the evaluated results are shown in Tables 6 and 7 below. The evaluations were carried out in a manner same as that of Example 1.

TABLE 6

|  | 550° C. | | | 700° C. | | | 950° C. | | |
| --- | --- | --- | --- | --- | --- | --- | --- | --- | --- |
|  | 40 sec. | 30 min. | 90 min. | 40 sec. | 30 min. | 90 min. | 40 sec. | 30 min. | 90 min. |
| Surface Roughness | △ | △ | △ | △ | ○ | △ | △ | △ | △ |
| Resistivity | △ | △ | △ | △ | ○ | △ | △ | △ | △ |

TABLE 7

|  | 550° C. | | | 700° C. | | | 950° C. | | |
| --- | --- | --- | --- | --- | --- | --- | --- | --- | --- |
|  | 40 sec. | 30 min. | 90 min. | 40 sec. | 30 min. | 90 min. | 40 sec. | 30 min. | 90 min. |
| Surface Roughness | △ | △ | △ | △ | ○ | △ | △ | △ | △ |
| Resistivity | △ | △ | △ | △ | ○ | △ | △ | △ | △ |

As can be seen in Tables 6 and 7 above, in the case where the heat treatment temperature and the heat treatment time period were below 600° C. and less than 1 minute respectively, although the surface roughness was adequate, the activation efficiency of the dopant Zn was diminished. On the other hand, in the case where the heat treatment temperature and the heat treatment time period were above 900° C. and more than 60 minutes respectively, although the dopant (Zn) activation was sufficient to increase the resistivity to more than $10^6$ Ω-cm, the surface roughness was aggravated.

<EXAMPLE 6>

A single crystal growing was carried out based on the epitaxial growing process to a thickness of 1 μm, thereby forming a GaN thin film upon an α-$Al_2O_3$ single crystal substrate having a (0001) face. For this growth, the conditions were as follows. That is, the MOCVD apparatus was used, and the crystal growing temperature was varied as shown in Table 8 below. Further, the Ga source for GaN was TEGa, and it was supplied at a flow rate of 103 μmol/min. The N source $NH_3$ for GaN was supplied at a flow rate of 7 slpm, and the carrier gas $H_2$ was supplied at a flow rate of 7 slpm. The intra-chamber pressure was maintained at 200 Torr, and the flow rate of $Cp_2Mg$ was 3 μmol/min.

For the thin film thus obtained, the crystal quality, the surface roughness and the carrier concentration were evaluated, and the evaluated results are shown in Table 8 below. The evaluations were carried out in a manner same as that of Example 1.

were all superior. The carrier concentration was also satisfactory by being $10^{16}$/$cm^3$–$10^{18}$/$cm^3$.

In contrast to this, in the case where the growth temperature was below 900° C., crystal defects were prevalent, and cubic or wurtzite crystalline structures were mixedly present, thereby aggravating the crystal quality. Further, due to the presence of the various crystal defects, the 2-dimensional growth quality was degraded, thereby increasing the surface roughness. Further, the prevalent crystal defects increased the carrier concentration to more than $10^{18}$/$cm^3$, thereby aggravating the quality of the single crystal thin film. On the other hand, in the case where the growth temperature exceeded 1100° C., the buffer layer which had been grown at a low temperature was adversely affected, thereby further increasing the occurrence of the crystal defects. Further, due to the surface dissociation of the nitrogen source, the crystal quality was further aggravated. Further, due to the surface dissociation of the N source material which was caused by the high growth temperature, the surface roughness was further deteriorated. Further, the same surface dissociation led to a carrier concentration of $5 \times 10^{17}$/$cm^3$.

<EXAMPLE 7>

A single crystal growing was carried out based on the epitaxial growing process to a thickness of 1 μm, thereby forming a GaN thin film upon an α-$Al_2O_3$ single crystal substrate having a (0001) face. For this growth, the conditions were as follows. That is, the MOCVD apparatus was used, and the flow rate of TEGa as the Ga source for GaN

TABLE 8

|  | 850° C. | 900° C. | 1000° C. | 1020° C. | 1050° C. | 1100° C. | 1150° C. |
| --- | --- | --- | --- | --- | --- | --- | --- |
| Crystal quality | x | △ | ○ | ○ | ○ | △ | x |
| Surface Roughness | △ | ○ | ○ | ○ | ○ | ○ | △ |
| Carrier concentration | x | △ | ○ | ○ | ○ | △ | △ |

As can be seen in Table 8 above, in the case where the condition of the MOCVD method in the present invention was satisfied by applying the growth temperature of 900–1100° C., the crystal quality and the surface roughness was varied as shown in Table 9 below, while the crystal growing temperature was 1000° C. Further, the N source $NH_3$ for GaN was supplied at a flow rate of 7 slpm, and the carrier gas $H_2$ was supplied at a flow rate of 7 slpm. The intra-chamber pressure was maintained at 200 Torr, and the flow rate of $Cp_2Mg$ was 3 μmol/min.

For the thin film thus obtained, the crystal quality and the surface roughness were evaluated, and the evaluated results are shown in Table 9 below. The evaluations were carried out in a manner same as that of Example 1.

TABLE 9

|  | 0.5 μmol | 100 μmol | 350 μmol |
| --- | --- | --- | --- |
| Crystal quality | x | ○ | x |
| Surface roughness | x | ○ | x |

As can be seen in Table 9 above, in the case where the conditions of the MOCVD method in the present invent ion were satisfied by applying the supply rate of the Ga source at 100 μmol/min, the crystal quality and the surface roughness were all superior.

In contrast to this, in the case where the supply rate of the Ga source was less than 1 μmol/min, the laminar flow could not be maintained during the MOCVD growing. Further, the growth speed was slowed down, and therefore, the GaN crystal quality and the surface roughness were aggravated. On the other hand, in the case where the supply rate exceeded 300 μmol/min, pre-reactions occurred due to the excessive source amount, thereby leading to the aggravation of the crystal quality and the surface roughness.

<EXAMPLE 8>

A single crystal growing was carried out based on the epitaxial growing process to a thickness of 1 μm, thereby forming a GaN thin film upon an $\alpha$-$Al_2O_3$ single crystal substrate having a (0001) face. For this growth, the conditions were as follows. That is, the MOCVD apparatus was used, and the supply rate of the N source $NH_3$ for GaN was varied as shown in Table 10 below, while the crystal growing temperature was 1000° C. The Ga source TEGa for GaN was supplied at a flow rate of 103 μmol/min, and the carrier gas $H_2$ was supplied at a flow rate of 7 slpm. The intra-chamber pressure was maintained at 200 Torr, and the flow rate of $Cp_2Mg$ was 3 μmol/min.

For the thin film thus obtained, the crystal quality and the surface roughness were evaluated, and the evaluated results are shown in Table 10 below. The evaluations were carried out in a manner same as that of Example 1.

TABLE 10

|  | 0.5 slpm | 7 slpm | 25 slpm |
| --- | --- | --- | --- |
| Crystal quality | x | ○ | x |
| Surface roughness | x | ○ | x |

As can be seen in Table 10 above, in the case where the conditions of the MOCVD method in the present invention were satisfied by applying the supply rate of the N source at 7 slpm, the crystal quality and the surface roughness were all superior.

In contrast to this, in the case where the supply rate of the N source was less than 1 slpm, the Ga source could not reach the substrate during the MOCVD growth, and the growth speed was also slowed down, thereby leading to the aggravation of the crystal quality and the surface roughness. On the other hand, in the case where the supply rate exceeded 20 slpm, pre-reactions were prevalent due to the excessive supply of the source, with the result that the crystal quality and the surface roughness were aggravated.

<EXAMPLE 9>

A single crystal growing was carried out based on the epitaxial growing process to a thickness of 1 μm, thereby forming a GaN thin film upon an $\alpha$-$Al_2O_3$ single crystal substrate having a (0001) face. For this growth, the conditions were as follows. That is, the MOCVD apparatus was used, and the supply rate of the carrier gas was varied as shown in Table 11 below, while the crystal growing temperature was 1000° C. The Ga source TEGa for GaN was supplied at a flow rate of 103 μmol/min, and the N source $NH_3$ for GaN was supplied at a flow rate of 7 slpm. The intra-chamber pressure was maintained at 200 Torr, and the flow rate of $Cp_2Mg$ was 3 μmol/min.

For the thin film thus obtained, the crystal quality and the surface roughness were evaluated, and the evaluated results are shown in Table 11 below. The evaluations were carried out in a manner same as that of Example 1.

TABLE 11

|  | 0.8 slpm | 10 slpm | 23 slpm |
| --- | --- | --- | --- |
| Crystal quality | Δ | ○ | Δ |
| Surface roughness | Δ | ○ | Δ |

As can be seen in Table 11 above, in the case where the supply rate of the carrier gas is less than 1 slpm, there was the apprehension that the laminar flow cannot be maintained. Further, the pre-reactions of the source became prevalent, thereby leading to the aggravation of the characteristics of the thin film. On the other hand, if the supply rate exceeds 20 slpm, the reactions of the source gases were diminished due to the excessive supply of the carrier gas, resulting in that the characteristics of the thin film were degraded.

<EXAMPLE 10>

A single crystal growing was carried out based on the epitaxial growing process to a thickness of 1 μm, thereby forming a GaN thin film upon an $\alpha$-$Al_2O_3$ single crystal substrate having a (0001) face. For this growth, the conditions were as follows. That is, the MOCVD apparatus was used, and the supply rate of the Zn source $Cp_2Mg$ was varied as shown in Table 12 below, while the crystal growing temperature was 1000° C. The Ga source TEGa for GaN was supplied at a flow rate of 103 μmol/min, and the N source $NH_3$ for GaN was supplied at a flow rate of 7 slpm, while the carrier gas $H_2$ was supplied at a flow rate of 7 slpm. The intra-chamber pressure was maintained at 200 Torr.

For the thin film thus obtained, the crystal quality and the surface roughness were evaluated, and the evaluated results are shown in Table 12 below. The evaluations were carried out in a manner same as that of Example 1.

TABLE 12

|  | 0.1 μmol | 3 μmol | 8 μmol |
| --- | --- | --- | --- |
| Crystal quality | ○ | ○ | Δ |
| Surface roughness | ○ | ○ | Δ |
| Resistivity | Δ | ○ | ○ |

As can be seen in Table 12 above, in the case where the supply rate of Mg was less than 0.2 μmol/min, the action and effect of the dopant were insignificant. On the other hand, in the case where the supply rate exceeded 6 μmol/min, if the p type dopant exceeded the solubility level, then the crystal quality and the surface roughness were aggravated.

Meanwhile, a part of the test pieces in which the supply rate of Mg was 3 μmol/min as in Table 12 was heat-treated at temperatures and times of Table 13 under an $NH_3/H_2$ atmosphere and under an $N_2$ atmosphere within the crystal growing chamber. Further, another part of the test pieces was heat-treated by subjecting them to an RTA at the temperatures and times of Table 14 under an $N_2$ atmosphere.

For the thin film thus obtained, the surface roughness and the resistivity were evaluated, and the evaluated results are shown in Tables 13 and 14 below. The evaluations were carried out in a manner same as that of Example 1.

TABLE 13

| | 550° C. | | | 700° C. | | | 950° C. | | |
|---|---|---|---|---|---|---|---|---|---|
| | 40 sec. | 30 min. | 90 min. | 40 sec. | 30 min. | 90 min. | 40 sec. | 30 min. | 90 min. |
| Surface Roughness | Δ | Δ | Δ | Δ | ○ | Δ | Δ | Δ | Δ |
| Resistivity | Δ | Δ | Δ | Δ | ○ | Δ | Δ | Δ | Δ |

TABLE 14

| | 550° C. | | | 700° C. | | | 950° C. | | |
|---|---|---|---|---|---|---|---|---|---|
| | 40 sec. | 30 min. | 90 min. | 40 sec. | 30 min. | 90 min. | 40 sec. | 30 min. | 90 min. |
| Surface Roughness | Δ | Δ | Δ | Δ | ○ | Δ | Δ | Δ | Δ |
| Resistivity | Δ | Δ | Δ | Δ | ○ | Δ | Δ | Δ | Δ |

As can be seen in Tables 13 and 14 above, in the case where the heat treatment temperature and time were below 600° C. and less than 1 minute respectively, although the surface roughness was adequately fine, the formation of Mg-H complex which increases the resistivity was not sufficiently realized. On the other hand, in the case where the temperature and time were over 900° C. and more than 60 minutes respectively, although the formation of Mg-H complex was sufficient, the dopant on the surface was dissociated.

<EXAMPLE 11>

A single crystal growing was carried out based on the epitaxial growing process to a thickness of 1 μm, thereby forming a GaN thin film upon an α-Al$_2$O$_3$ single crystal substrate having a (0001) face (a buffer layer being formed to a thickness of 350). For this growth, the conditions were as follows. That is, a VPE apparatus was used, and the crystal growing temperature was varied as shown in Table 15 below. The Ga source TMGa for GaN was supplied at a flow rate of 50 μmol/min, and the N source NH$_3$ for GaN was supplied at a flow rate of 3 slpm, while the carrier gas H$_2$ was supplied at a flow rate of 3 slpm. The intra-chamber pressure was maintained at 100 Torr.

For the thin film thus obtained, the crystal quality, the surface roughness and the carrier concentration were evaluated, and the evaluated results are shown in Table 15 below. The evaluations were carried out in a manner same as that of Example 1.

carrier concentration was $10^{16}$/cm$^3$–$10^{17}$/cm$^3$, thereby showing superior characteristics.

In contrast to this, in the case where the growth temperature was below 800° C. and above 1100° C., the characteristics were inadequate.

<EXAMPLE 12>

Figure 1:
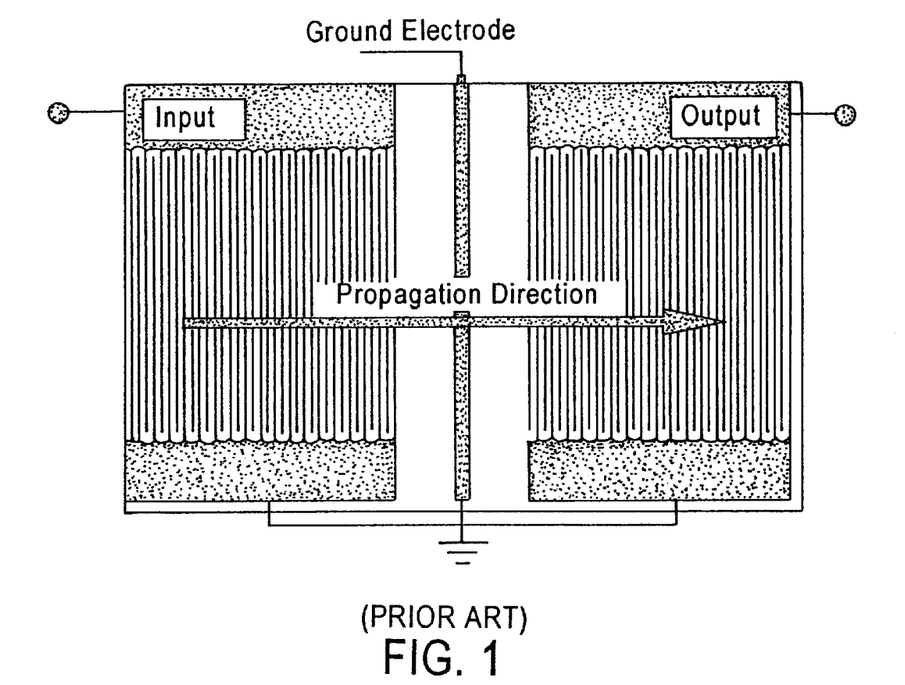
FIG. 1 is a plan view of the SAW filter.
Figure 2:
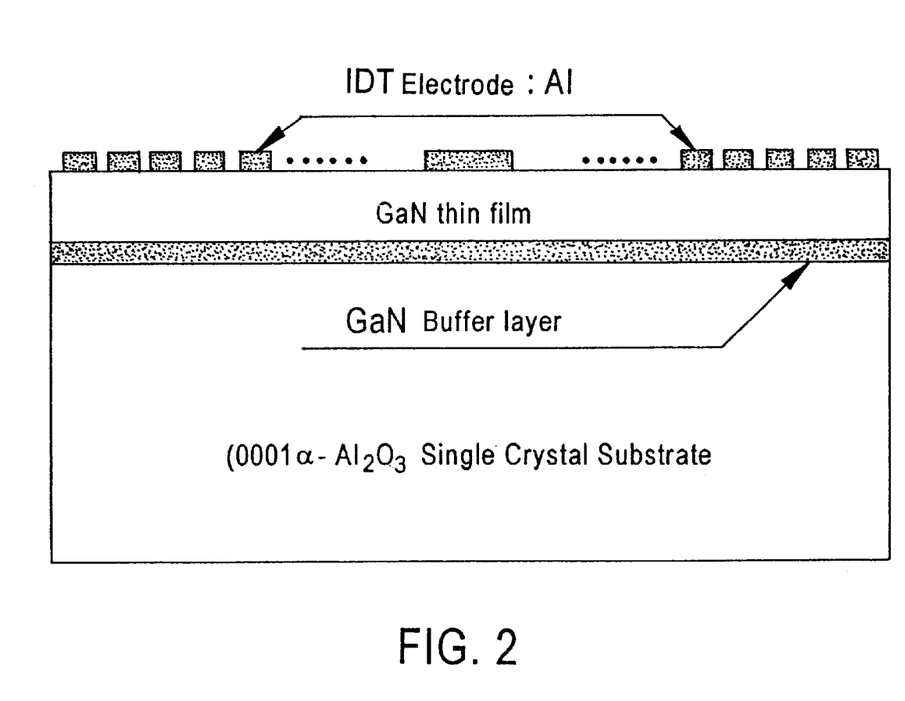
FIG. 2 is a cross sectional view of the GaN SAW filter.

A single crystal growing was carried out based on the epitaxial growing process to a thickness of 1 μm, thereby forming a GaN thin film upon an α-Al$_2$O$_3$ single crystal substrate having a (0001) face (a buffer layer being formed to a thickness of 350). For this growth, the conditions were as follows. That is, the MOCVD apparatus was used, and the crystal growing temperature was 1000° C. The Ga source TMGa for GaN was supplied at a flow rate of 103 μmol/min, and the N source NH$_3$ for GaN was supplied at a flow rate of 7 slpm, while the carrier gas H$_2$ was supplied at a flow rate of 7 slpm. The intra-chamber pressure was maintained at 200 Torr. Thereafter, aluminum electrodes were formed to a thickness of 2000 A, thereby completing input/output IDT electrodes. Thus the GaN SAW filter of FIG. 1 was manufactured. FIG. 2 is a sectional view of the filter of FIG. 1.

Figure 3A:
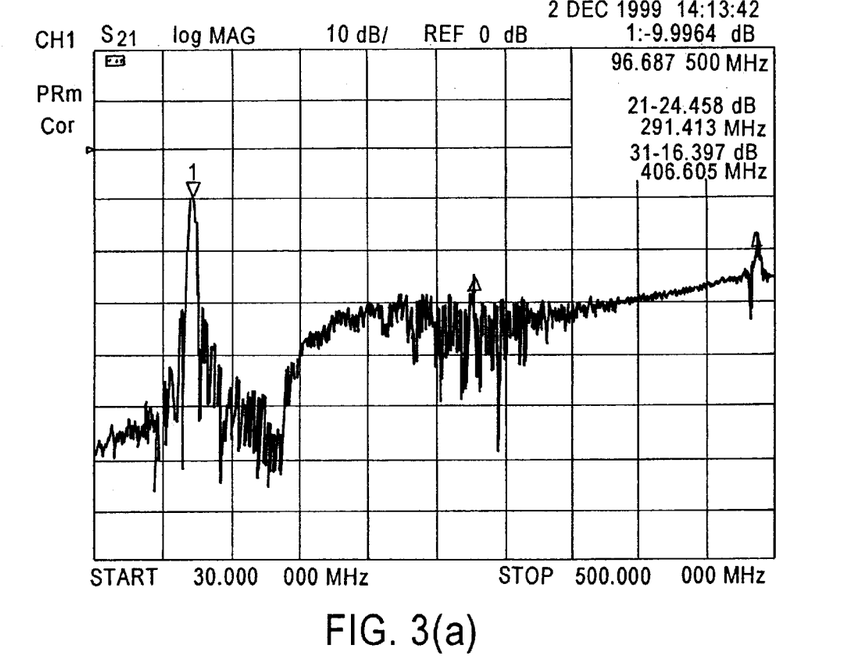
FIGS. 3a and 3b are graphical illustrations showing the harmonic wave mode characteristics of the GaN SAW filter.
Figure 3B:
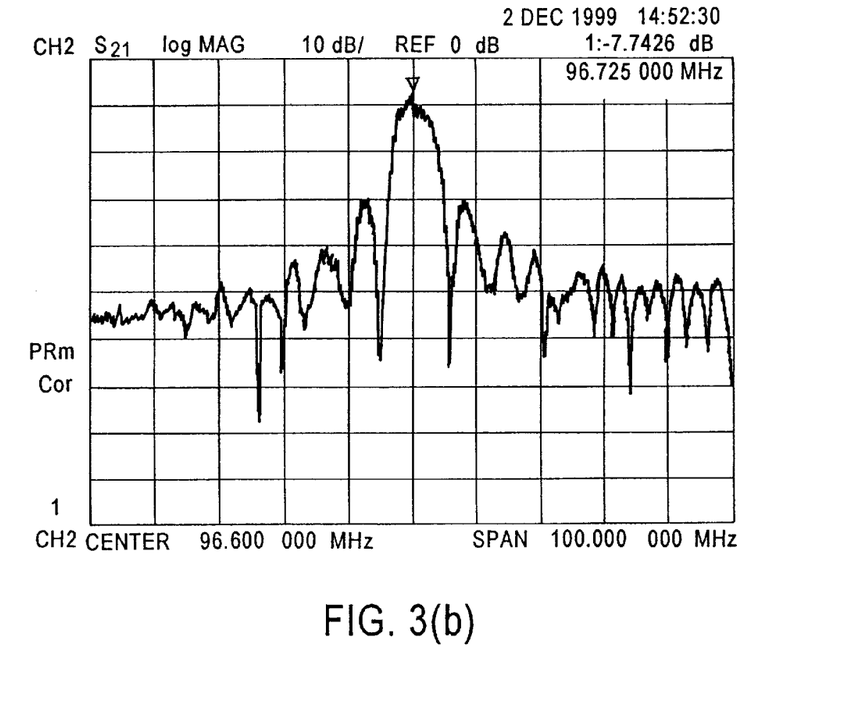

For the obtained filter, the harmonics were measured, and the measured results are illustrated in FIGS. 3a and 3b.

Referring to FIG. 3a, in order to measure the characteristics of the harmonics, a sweeping was carried out from 30 MHz to 500 MHz. As can be seen in FIG. 3a, the fundamental mode and the harmonic modes were 96.687, 291.413 and 486.605 MHz respectively, these being the typical sinc

TABLE 15

| | 750° C. | 800° C. | 900° C. | 1000° C. | 1050° C. | 1100° C. | 1150° C. |
|---|---|---|---|---|---|---|---|
| Crystal quality | x | Δ | ○ | ○ | ○ | Δ | x |
| Surface Roughness | Δ | ○ | ○ | ○ | ○ | ○ | Δ |
| Carrier concentration | x | Δ | ○ | ○ | ○ | Δ | Δ |

As can be seen in Table 15 above, in the case where the VPE conditions were satisfied, that is, in the case where the growing temperature was 800–1100° C., both the crystal quality and the surface roughness were superior. Further, the function wave shape. In the case of the fundamental mode 96.687 MHz, with the impedance match not realized, the insertion loss was −9 dB, thereby showing a superior characteristic.

FIG. 3b enlargedly illustrates the frequency characteristics near the center frequency. As can be seen in FIG. 3b, the ripples at the center frequency were considerably improved. This owes to the fact that the insertion loss had been improved. The propagation velocity of the GaN SAW filter, which was calculated from the center frequency of 96.687 MHz and the wavelength ($\lambda$=60 $\mu$m, $\lambda$/4=15 $\mu$m), was 5803 m/s. In view of the fact that the propagation velocities of the conventional commercialized single crystal thin films (LiNbO$_3$ and LiTaO$_3$) were 3480–4555 m/s and 3230–4156 m/s respectively, that of the present invention was far more superior. Further, the temperature delay constant (TDC, ppm/°C.) was almost zero in the case of the GaN thin film. Further, the energy band gap was as high as 3.4 eV, and therefore, the filter can operate stably. Further, at the fundamental mode of 96.687 MHz, the side lobe decay was 23 dB or more, and thus, the impedance match was very much superior.

According to the present invention as described above, there are realized superior characteristics such as a low insertion loss, a high temperature stability, a high output power, and a temperature delay constant approaching to zero. Further, a frequency characteristic for GHz bands can be easily obtained.

What is claimed is:

1. A SAW filter of a high frequency band, comprising:
    a single crystal substrate selected from the group consisting of an $\alpha$-Al$_2$O$_3$ substrate, a silicon substrate having (100) or (111) faces, a SiC substrate, and a MgAl$_2$O$_4$ substrate;
    a GaN buffer layer formed to a thickness 200–500 Å upon said substrate;
    a GaN piezoelectric single crystal thin film of [0001] direction formed to a thickness of 0.3–300 $\mu$m upon said suffer layer; and
    an IDT electrode pattern formed upon said GaN piezoelectric single crystal thin film.

2. The SAW filter as claimed in claim 1, wherein said $\alpha$-Al$_2$O$_3$ single crystal substrate has a face selected from among (0001), (1102) and (1120) faces.

3. The SAW filter as claimed in claim 1, wherein said GaN piezoelectric single crystal thin film has a thickness of 0.5–10 $\alpha$m.

4. A SAW filter of a high frequency band, comprising:
    a single crystal substrate selected from the group consisting of an $\alpha$-Al$_2$O$_3$ substrate, a silicon substrate having (100) or (111) faces, a SiC substrate, and a MgAl$_2$O$_4$ substrate;
    a GaN piezoelectric single crystal thin film of [0001] direction formed to a thickness of 0.3–300 $\mu$m upon said substrate;
    an IDT electrode pattern formed upon said GaN piezoelectric single crystal thin film; and
    a GaN buffer layer formed between said single crystal substrate and said GaN single crystal thin film to a thickness of 200–500 Å.

5. A method for manufacturing a SAW filter of a high frequency band, comprising the steps of:
    preparing a single crystal substrate selected from the group consisting of an $\alpha$-Al$_2$O$_3$ substrate, a silicon substrate having (100) or (111) faces, a SiC substrate, and a MgAl$_2$O$_4$ substrate;
    forming a GaN buffer layer to a thickness 200–500 Å upon said substrate;
    epitaxially growing a GaN piezoelectric single crystal thin film of [0001] direction to a thickness of 0.3–300 $\mu$m upon said buffer layer; and
    forming an IDT electrode pattern upon said GaN piezoelectric single crystal thin film.

6. The method as claimed in claim 5, wherein during the growth of said single crystal film, DMZn is supplied at a flow rate of 0.06–10 $\mu$mol/min.

7. The method as claimed in claim 6, wherein after growing said GaN single crystal film, a heat treatment is carried out at a temperature of 600–900° C. for 1–60 minutes under an NH$_3$/H$_2$ mixed atmosphere within an epitaxial growing apparatus; or the heat treatment is carried out at a temperature of 400–900° C. for 1–60 minutes under a nitrogen atmosphere within a furnace other than said epitaxial growing apparatus or by applying an RTA (rapid thermal annealing).

8. The method as claimed in claim 5, wherein said $\alpha$-Al$_2$O$_3$ single crystal substrate has a face selected from among (0001), (1102) and (1120) faces.

9. The method as claimed in 5, wherein during the growth of said single crystal film, Cp$_2$ Mg is supplied at a flow rate of 0.2–6 $\mu$mol/min.

10. The method as claimed in claim 9, wherein after growing said GaN single crystal film, a heat treatment is carried out at a temperature of 600–900° C. for 1–60 minutes under an NH$_3$/H$_2$ mixed atmosphere within an epitaxial growing apparatus; or the heat treatment is carried out at a temperature of 400–900° C. for 1–60 minutes under a nitrogen atmosphere within a furnace other than said epitaxial growing apparatus or by applying an RTA (rapid thermal annealing).

11. The method as claimed in claim 5, wherein said GaN single crystal is grown by applying an MOCVD (metal organic chemical vapor deposition) process at conditions of: a growth temperature of 900–1000° C.; a Ga source supply rate of 1–300 $\mu$mol/min; and an N source supply rate of 1–20 slpm.

12. The method as claimed in claim 5, wherein said GaN single crystal is grown by applying an MBE (metal beam epitaxy) process at conditions of: a growth temperature of 600–900° C.; a Ga source supply rate of 1–300 $\mu$mol/min; and an N source supply rate of 1–20 slpm.

13. The method as claimed in claim 5, wherein said GaN single crystal is grown by applying a VPE (vapor phase epitaxy) process or an HVPE (hybrid vapor phase epitaxy) process at conditions of: a growth temperature of 800–1100° C.; a Ga source supply rate of 1–300 $\mu$mol/min; and an N source supply rate of 1–20 slpm.

14. The method as claimed in claim 5, wherein TMGa or TEGa is a Ga supply source of GaN.

15. The method as claimed in claim 5, wherein NH$_3$ is an N supply source of GaN.

16. The method as claimed in claim 5, wherein during a growth of said single crystal film, a carrier gas is supplied at a flow rate of 1–20 slpm, and an intra-chamber pressure is applied at 1–760 Torr.

* * * * *